United States Patent
Chuang et al.

(10) Patent No.: US 6,893,919 B2
(45) Date of Patent: May 17, 2005

(54) FLOATING GATE AND FABRICATING METHOD OF THE SAME

(75) Inventors: Ying-Cheng Chuang, Bade (TW); Chung-Lin Huang, Taichung (TW)

(73) Assignee: Nanya Technology Corporation, Taoyuan (TW)

( * ) Notice: Subject to any disclaimer, the term of this patent is extended or adjusted under 35 U.S.C. 154(b) by 5 days.

(21) Appl. No.: 10/810,740

(22) Filed: Mar. 26, 2004

(65) Prior Publication Data

US 2004/0180498 A1 Sep. 16, 2004

Related U.S. Application Data

(62) Division of application No. 10/435,416, filed on May 9, 2003.

(30) Foreign Application Priority Data

Aug. 15, 2002 (TW) .......................................... 91118386 A

(51) Int. Cl.$^7$ ............................................. H01L 21/336
(52) U.S. Cl. ........................ 438/257; 438/596; 257/315

(58) Field of Search .......................... 438/201, 257–267, 438/592–596; 257/314–316

(56) References Cited

U.S. PATENT DOCUMENTS 6,524,915 B2 * 2/2003 Kim et al. .................. 438/267
2004/0033631 A1 * 2/2004 Clark et al. .................. 438/14

* cited by examiner

*Primary Examiner*—Matthew Smith
*Assistant Examiner*—Calvin Lee
(74) *Attorney, Agent, or Firm*—Quintero Law Office

(57) ABSTRACT

A floating gate and a fabricating method of the same. A semiconductor substrate is provided. A gate dielectric layer and a conducting layer are sequentially formed on the semiconductor substrate. A patterned hard mask layer having an opening is formed on the conducting layer, wherein a portion of the conducting layer is exposed through the opening. A spacer is formed on the sidewall of the opening. The patterned hard mask layer is removed. A conducting spacer is formed on the sidewall of the spacer. The exposed conducting layer and the exposed gate dielectric layer are sequentially removed.

17 Claims, 4 Drawing Sheets

FLOATING GATE AND FABRICATING METHOD OF THE SAME

This application is a divisional of U.S. application Ser. No. 10/435,416, filed May 9, 2003.

BACKGROUND OF THE INVENTION

1. Field of the Inventions

The invention is relates to a floating gate, and more particularly to a floating gate with multi-tips and a method for fabricating a floating gate.

2. Descriptions of the Related Art

Memory devices for non-volatile storage of information are currently in widespread use, in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

An advantage of EPROM is that it is electrically programmed, but for erasing, EPROM requires exposure to ultraviolet (UV) light.

In many circuit designs it is desirable to have a non-volatile memory device that can be erased and repro-grammed in-circuit, without the need to remove the device for erasing and reprogramming.

EEPROM devices have the advantage of electrical programming and erasing, achieved by charging and discharging actions controlled by the control gate. The actions also affect the conductivity of the channel between source and drain.

One advantage of flash memory is its capacity for block-by-block memory erasure. Furthermore, the speed of memory erasure is fast, and normally takes just 1 to 2 seconds for the complete removal of a whole block of memory. Another advantage of flash memory is low electric consumptions. The voltages of a control gate, a source, and a drain are adjusted to program or erase in a split gate flash memory.

FIGS. 1a to 1c are cross-sections of the conventional method for fabricating a floating gate of a split gate flash memory.

In FIG. 1a, a silicon substrate 101 is provided. A gate oxide layer 102, a doped polysilicon layer 103, and a nitride layer 104 having an opening 105 are sequentially formed on the silicon substrate 101.

In FIG. 1b, the doped polysilicon layer 105 exposed by the opening 105 is oxidized to form an oxide layer 106 with a Bird's Beak shaped edge.

In FIG. 1c, the nitride layer 104 is removed. The doped polysilicon layer 103 is anisotropically etched to form a floating gate 103a using the oxide layer 106 as an etching mask.

A split gate flash memory is completed after a control gate is formed on the floating gate and the silicon substrate 101 is implanted to form source/drain devices.

In the program step, a high voltage is applied between the source and drain. Another high-voltage current is applied to the control gate and is transmitted to the floating by electric capacity coupling, a high voltage electrical field is then produced on the film gate oxide layer. The electricity is injected into the floating gate through the film gate oxide layer from the drain.

In the erasure step, high voltage is applied between the drain and the control gate. A high voltage electrical field is produced on the film gate oxide layer by electric capacity coupling. The electricity is injected into the drain through the film gate oxide layer from the floating gate. The gate oxide layer is damaged by high voltage.

When the edge of the floating gate is a tip, electrical field is easily concentrated in the tip, and the point is easily discharged. If the point discharge increases, the erasure effect in a flash memory will increase.

In additions, the die size is larger due to the additions of programming circuitry and there are more processing and testing steps involved in the manufacture of these types of memory devices.

SUMMARY OF THE INVENTION

The present invention is directed to a floating gate with multiple tips and a method for fabricating the floating gate.

Accordingly, the present invention provides a method for forming a floating gate. A semiconductor substrate is provided, wherein a gate dielectric layer and a conducting layer are sequentially formed on the semiconductor substrate. A patterned hard mask layer having an opening is formed on the conducting layer, wherein a portion of the surface of the conducting layer is exposed through the opening. A spacer is formed on a sidewall of the opening. The patterned hard mask layer is removed. A conducting spacer is formed on a sidewall of the spacer. The exposed conducting layer and the exposed gate dielectric layer are removed sequentially.

Accordingly, the present invention also provides a method for forming a floating gate. A semiconductor substrate is provided, wherein a gate dielectric layer and a first conducting layer are sequentially formed on the semiconductor substrate. A hard mask layer and a patterned resist layer having a first opening are sequentially formed on the first conducting layer, wherein a portion of the surface of the hard mask layer is exposed through the first opening. The hard-mask layer is etched to form a second opening using the patterned resist layer as a mask. An insulating layer is conformally formed on the surface of the hard mask layer, wherein the second opening is filled with the insulating layer. The insulating layer is anisotropically etched to form a first spacer on a sidewall of the second opening. The hard mask layer is removed. A second conducting layer is conformally formed on the surface of the first conducting layer and the first spacer. The second conducting layer is anisotropically etched to form a second spacer on a sidewall of the first spacer. The exposed first conducting layer and the gate dielectric layer are sequentially removed.

Accordingly, the present invention provides a floating gate, wherein the floating gate comprises a conductive base and a pair of conductive protruding layers, wherein the conducting protruding layers are formed on the conductive base, each of the conductive protruding layers has a bottom portion and a tip of the top portion respectively, the bottom portion connects to the conductive base, the conductive protruding layer stretches out toward the other layer from the bottom portion to the protruding tip of the top portion thereof, and a floating gate with multiple tips consists of the conductive base and the conductive protruding layer.

Accordingly, the present invention also provides a floating gate, wherein the floating gate comprises a conductive base and a conductive protruding layer, wherein the conductive protruding layer is formed on the conductive base, the conductive protruding layer has a first tip portion and a second tip portion, the first tip portion has a first bottom portion and a first tip of the top portion, the second tip portion has a second bottom portion and a second tip of the top portion, the first bottom portion and the second bottom portion connect to the conductive base, the first tip of the top portion stretches out toward the second tip of the top portion from the first bottom portion, and the second tip of the top portion stretches out toward the first tip of the top portion from the second bottom portion, and a floating gate with multiple tips consists of the conductive base and the conductive protruding layer.

BRIEF DESCRIPTION OF THE DRAWINGS

For a better understanding of the present invention, reference is made to a detailed description to be read in conjunctions with the accompanying drawings, in which.

DETAILED DESCRIPTION OF THE INVENTION

FIGS. 2a to 2i are cross sections of a method for forming a floating gate with multiple tips of the present invention.

Figure 1A:
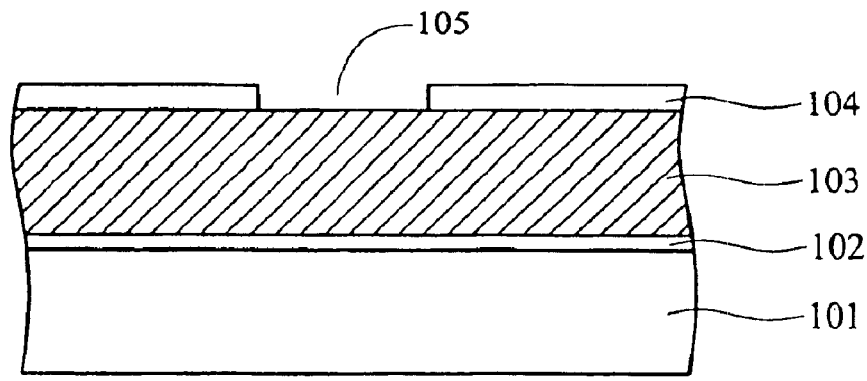
FIGS. 1a to 1c are cross-sections of the conventional method for fabricating a floating gate of a split gate flash memory.
Figure 1B:
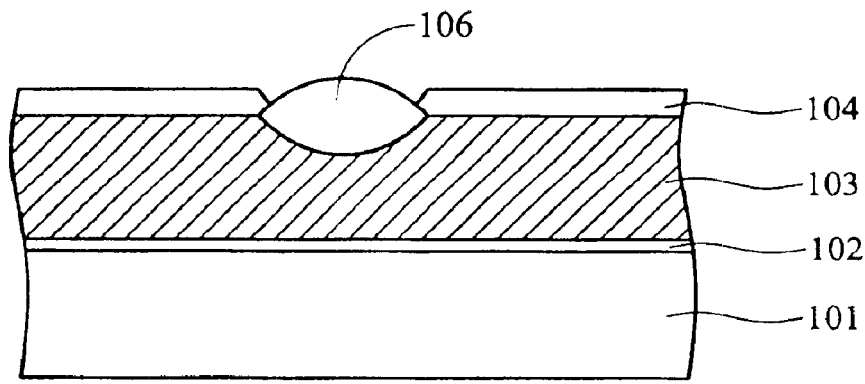
Figure 1C:
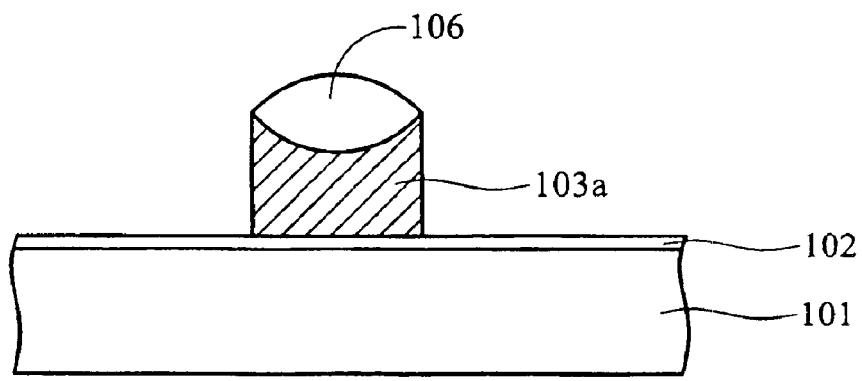
Figure 2A:
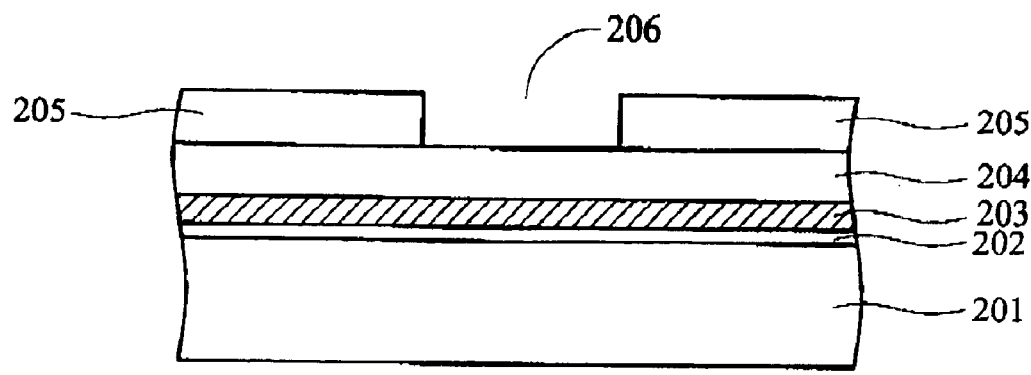
FIGS. 2a to 2i are cross-sections of the method for fabricating a floating gate of a split gate flash memory of the present invention.

In FIG. 2a, a semiconductor substrate 201, such as a silicon substrate, is provided. A gate dielectric layer 202, such as a gate oxide layer, a first conducting layer 203, such as a poly-layer, a hard mask layer 204, such as an LPCVD-silicon nitride layer, and a patterned resist layer 205 having an opening 206 are sequentially formed on the surface of the semiconductor substrate 201, wherein a floating gate with multiple tips will be formed in the opening 206 in subsequent steps. The gate oxide layer is a high quality oxide layer and which is formed by thermal oxidations process. P-type ions or N-type ions is doped into the first conducting layer 203 to form a P-type gate or an N-type gate respectively.

Figure 2B:
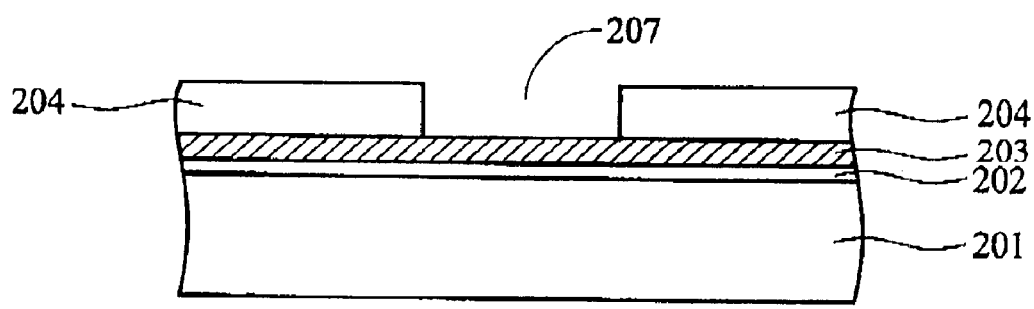

In FIG. 2b, the hard mask layer 204 is etched to form an opening 207 using the patterned resist layer 205 as a mask, wherein a portion of the surface of the first conducting layer 203 is exposed through the opening 207.

Figure 2C:
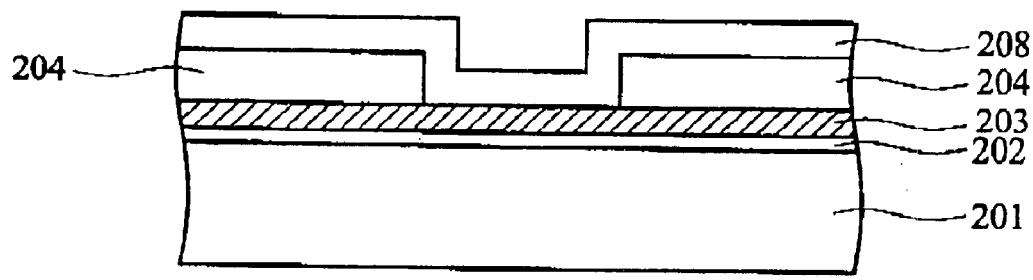

In FIG. 2c, an insulating layer 208, such as a silicon oxide layer, is conformally formed on the surface of the hard mask layer 204 and the opening 207 using the method of low pressure chemical vapor depositions (LPCVD), plasma enhanced chemical vapor depositions (PECVD), or high temperature oxidations (HTO), wherein the material of the insulating layer 208 is different from the hard mask layer 204.

Figure 2D:
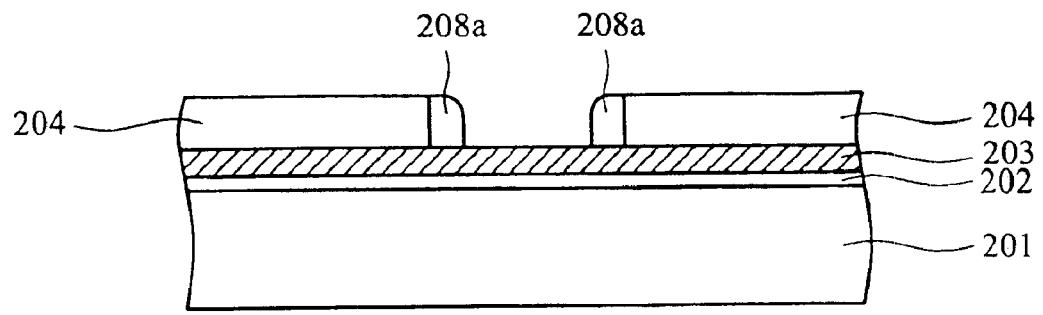

In FIG. 2d, the insulating layer 208 is anisotropically etched to form a spacer 208a on a surface of the sidewall of the opening 207. The method of anisotropic etching is reactive ions etching (RIE) or plasma etching.

Figure 2E:
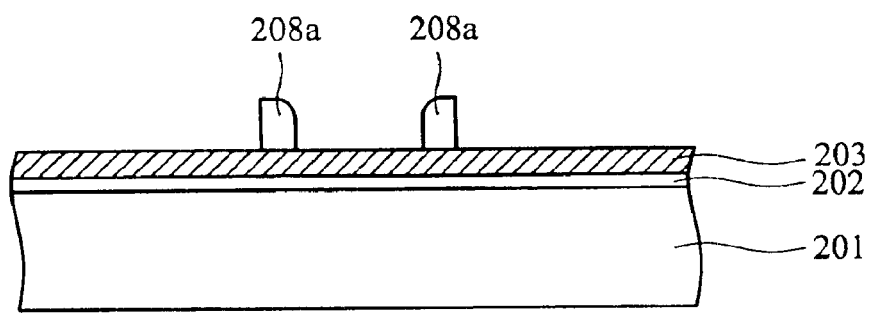

In FIG. 2e, the hard mask layer 204 is removed.

Figure 2F:
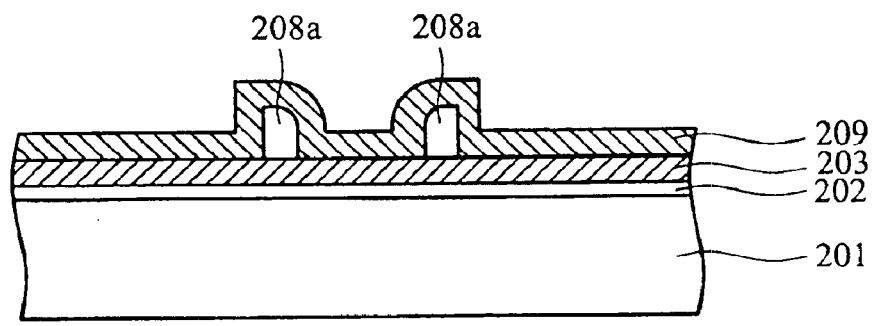

In FIG. 2f, a second conducting layer 209, such as a poly-layer, is conformally formed on the surface of the first conducting layer 203 and the spacer 208a. The second conducting layer 209 is doped P-type or N-type ions to form a P-type gate or N-type gate as deciding.

A gate will consist of a portion of the second conducting layer 209 and a portion of the first conducting layer 203 in following steps, wherein the doping ions in the second conducting layer 209 and the first conducting layer 203 are the same.

Figure 2G:
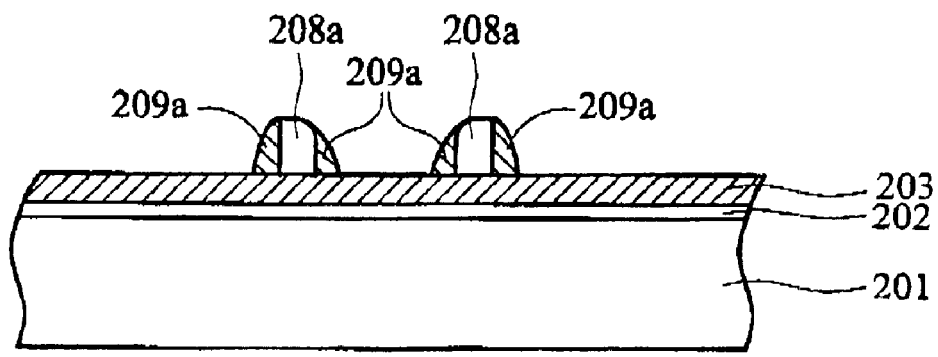

In FIG. 2g, the second conducting layer is anisotropically etched to form a second spacer covering the sidewall of the first spacer 208a.

Figure 2H:
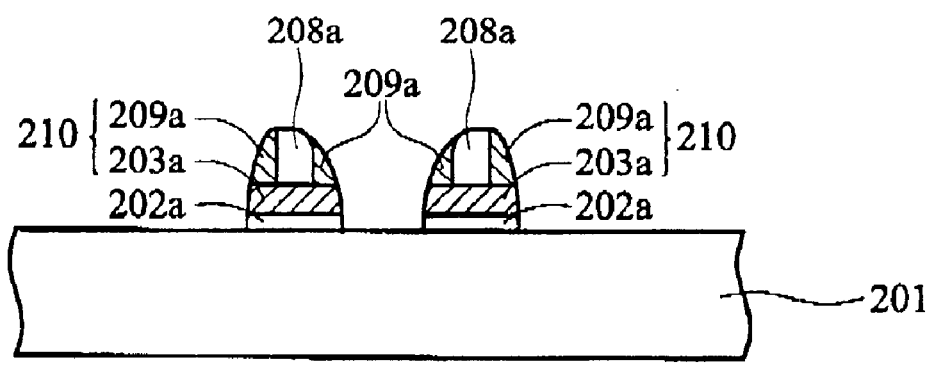

In FIG. 2h, the exposed conducting layer 203, and the exposed gate dielectric 202 are sequentially removed, and therefore a floating gate with multiple tips 210 consists of the first conducting layer 203a and the second spacer 209a.

The floating gate formed by the method of the present invention consists of a conductive base 203a and a pair of conductive protruding layers 209a, wherein the conductive protruding layers 209a are formed on the conductive base 203a, the conductive protruding layers 209a do not contact each other directly, and the bottom portion connects to the conductive base 203a. Each conductive protruding layer 209a has a bottom portion and a tip of the top portion respectively, the conductive protruding layer 209a stretches out toward the other layer from the bottom portion to the tip of the top and the conductive protruding layers 209a do not contact each other. A floating gate with multiple tips 210 consists of the conductive base 203c and the conductive protruding layer 209a, wherein the floating gate 210 of the present invention will consist of at least two tip structures.

Figure 2I:
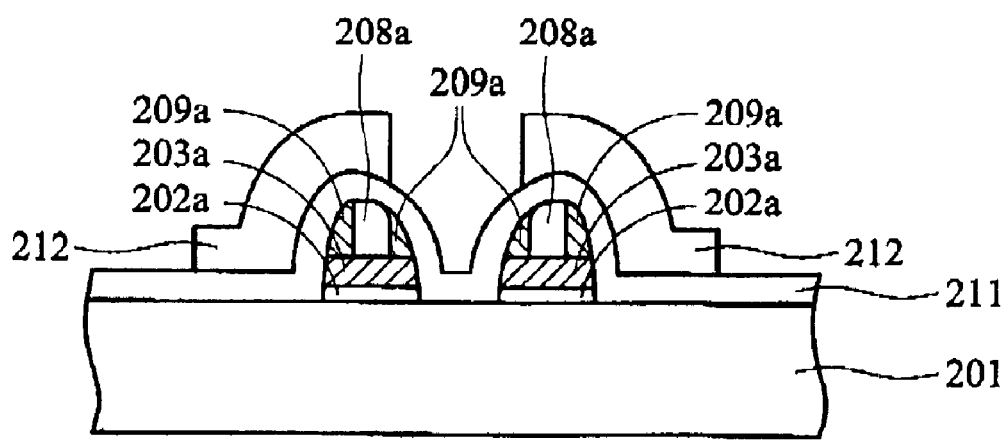

In FIG. 2i, a gate dielectric layer 211, such as silicon oxide layer, and a control gate 212, such as doped poly-layer or doped amorphous poly-layer or polycide metal layer, are sequentially formed on the floating gate with multiple tips 210 as shown in FIG. 2h, and therefore a flash memory is complete.

The effect of the electrical field is easily concentrated in the tip, and the point is easily discharged. The point discharge effect of the present invention is increased because the floating gate has multiple tips. Therefore, the data erasure effect of the flash memory having a floating gate with multiple tips is increased.

The process of the method for forming a floating gate of the present invention is not only simple but also forming two floating gate at one time, so as to the space of the wafer is keep, and packing density of the memory unit is increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretations so as to encompass all such modifications and similar arrangements.

What is claimed is:

1. A method for forming a floating gate, comprising:
providing a semiconductor substrate, wherein a gate dielectric layer and a conducting layer are sequentially formed on the semiconductor substrate;
forming a patterned hard mask layer having an opening on the semiconductor substrate, wherein a portion of the surface of the conducting layer is exposed through the opening;
forming a spacer on a sidewall of the opening;
removing the patterned hard mask layer;
forming a conducting spacer on a sidewall of the spacer;
and sequentially removing the exposing exposed conducting layer and the exposing exposed gate dielectric layer.

2. The method for forming a floating gate of claim 1, wherein the hard mask layer is a silicon nitride layer.

3. The method for forming a floating gate of claim 1, wherein the gate dielectric layer is gate oxide layer.

4. The method for forming a floating gate of claim 1, wherein the conducting layer is a poly-layer.

5. The method for forming a floating gate of claim 1, wherein the spacer is an insulating layer.

6. The method for forming a floating gate of claim 5, wherein the insulating layer is silicon oxide layer.

7. The method for forming a floating gate of claim 1, wherein the material of the insulating layer is different from the hard mask layer.

8. The method for forming a floating gate of claim 1, wherein the conducting spacer is a poly-layer.

9. The method for forming a floating gate of claim 1, wherein the floating gate consists of the conducting layer and the conducting spacer.

10. A method for forming a floating gate, comprising:

providing a semiconductor substrate; sequentially forming a gate dielectric layer and a first conducting layer on the semiconductor substrate;

sequentially forming a hard mask layer and a patterned resist layer having a first opening on the first conducting layer, wherein a portion of the hard mask layer is exposed through the opening;

etching the hard mask layer to form a second opening using the patterned resist layer as a mask;

removing the patterned resist layer;

conformally forming an insulating layer on the surface of the hard mask layer, wherein the second opening is filled with the insulating layer;

anisotropically etching the insulating layer to form a first spacer on a sidewall of the second opening; removing the hard mask layer;

conformally forming a second conducting layer on the surface of the first conducting layer and the first spacer;

anisotropically etching the second conducting layer to form a second spacer on a sidewall of the first spacer;

sequentially removing the exposed first conducting layer and the exposed gate dielectric layer, wherein a floating gate consists of a first conducting layer and the second spacer.

11. The method for forming a floating gate of claim 10, wherein the first conducting layer is a poly-layer.

12. The method for forming a floating gate of claim 10, wherein the hard mask layer is a silicon nitride layer.

13. The method for forming a floating gate of claim 10, wherein the insulating layer is a silicon oxide layer.

14. The method for forming a floating gate of claim 10, wherein the material of the insulating layer is different from the hard mask layer.

15. The method for forming a floating gate of claim 10, wherein the second conducting layer is a poly-layer.

16. The method for forming a floating gate of claim 10, wherein a method of the anisotropically etching is a plasma dry-etching process.

17. The method for forming a floating gate of claim 10, wherein the gate dielectric layer is a gate oxide layer.

* * * * *